United States Patent [19]

Nakano et al.

[11] Patent Number: 6,147,390
[45] Date of Patent: Nov. 14, 2000

[54] SOLID-STATE IMAGING DEVICE WITH FILM OF LOW HYDROGEN PERMEABILITY INCLUDING OPENINGS

[75] Inventors: Takashi Nakano; Kohichi Arai; Nobukazu Teranishi; Nobuhiko Mutoh, all of Tokyo, Japan

[73] Assignee: NEC Corporation, Japan

[21] Appl. No.: 09/052,306

[22] Filed: Mar. 31, 1998

[30]         Foreign Application Priority Data

Apr. 7, 1997   [JP]   Japan .................................. 9-088320

[51] Int. Cl.[7] .................. H01L 27/148; H01L 32/0216
[52] U.S. Cl. ....................... 257/437; 257/436; 257/225
[58] Field of Search .................................. 257/436, 437, 257/225

[56]                 References Cited

U.S. PATENT DOCUMENTS 5,523,609   6/1996   Fukusho ................................. 257/537

FOREIGN PATENT DOCUMENTS

| 63-14466 | 1/1985 | Japan | H01L 27/14 |
| 60-201659 | 10/1985 | Japan | H01L 27/14 |
| 4-152674 | 5/1992 | Japan | H01L 27/148 |
| 4152674 | 5/1992 | Japan | H01L 27/148 |
| 4-206571 | 7/1992 | Japan | H01L 27/14 |
| 4206571 | 7/1992 | Japan | H01L 27/14 |
| 4124225 | 11/1992 | Japan | G02B 27/10 |
| 5-198788 | 8/1993 | Japan | H01L 27/148 |
| 6-209100 | 7/1994 | Japan | H01L 27/148 |
| 8-148665 | 6/1996 | Japan | H01L 27/14 |
| 8-222722 | 8/1996 | Japan | H01L 27/148 |
| 8-288490 | 11/1996 | Japan | H01L 27/148 |
| 10-112532 | 4/1998 | Japan | H01L 27/14 |

*Primary Examiner*—Jerome Jackson, Jr.
*Attorney, Agent, or Firm*—Hayes, Soloway, Hennessey, Grossman & Hage, P.C.

[57]                     ABSTRACT

A semiconductor substrate has a sensor disposed in a surface layer on an entrance surface thereof for receiving incident light, and an intermediate-refractive-index film is disposed on the entire entrance surface of the semiconductor substrate either directly or with an insulating film interposed therebetween. The intermediate-refractive-index film has a refractive index lower than the semiconductor substrate and a low hydrogen permeability. A thin film is disposed on an entrance surface of the intermediate-refractive-index film and having refractive index lower than the intermediate-refractive-index film, the thin film being permeable to hydrogen. The intermediate-refractive-index film serves as a reflection-resistant film. Reflections of incident light applied through the thin film and the reflection-resistant film to the sensor of the semiconductor substrate are suppressed. The intermediate-refractive-index film has a hole defined therein for passage of hydrogen therethrough upon hydrogen alloying. After the thin film is formed on the surface of the intermediate-refractive-index film, hydrogen passes through the hole in the intermediate-refractive-index film to reach the surface of the semiconductor substrate near the sensor upon hydrogen alloying.

7 Claims, 13 Drawing Sheets

SOLID-STATE IMAGING DEVICE WITH FILM OF LOW HYDROGEN PERMEABILITY INCLUDING OPENINGS

BACKGROUND OF THE INVENTION

1. Field of the Invention

The present invention relates to a solid-state imaging device and a method of manufacturing such a solid-state imaging device, and more particularly to a solid-state imaging device having a film disposed on a sensor thereof for suppressing light reflections from a semiconductor substrate, and a method of manufacturing such a solid-state imaging device.

2. Description of the Related Art

Conventional solid-state imaging devices are disclosed in Japanese Patent Laid-Open Publication No. 206571/92 and Japanese Patent Laid-Open Publication No. 152674/92, for example. The disclosed solid-state imaging devices have a reflection-resistant film disposed on the entrance surface of a photodiode for increased sensitivity thereof.

The solid-state imaging device disclosed in Japanese Patent Laid-Open Publication No. 206571/92 is shown in FIG. 1 of the accompanying drawings. As shown in FIG. 1, the solid-state imaging device has a photodiode 55 as a sensor and a vertical CCD (Charge-Coupled Device) 56 which are disposed in a surface layer of a silicon substrate 59. A silicon oxide film 49 serving as an oxide film is disposed over the photodiode 55 and the vertical CCD 56. An intermediate-refractive-index film 48 is disposed on the surface of the silicon oxide film 49. The silicon oxide film 49 and the intermediate-refractive-index film 48 are shared by the photodiode 55 and the vertical CCD 56.

Gate electrodes 46 are disposed on the surface of the intermediate-refractive-index film 48 over the vertical CCD 56. The gate electrodes 46 are covered with light blocking films 44 of aluminum (Al) or tungsten (W) with interlayer insulating films 45 interposed therebetween. The surfaces of the light blocking films 44 and the surface of the intermediate-refractive-index film 48 over the photodiode 55 are covered with a protective film 43 such as a silicon oxide film. The intermediate-refractive-index film 48 comprises a silicon nitride film. The silicon nitride film as the intermediate-refractive-index film 48 has a refractive index which is of a substantially intermediate value between the refractive index of the silicon oxide film as the protective film 43 and the refractive index of the silicon substrate 59. The refractive index of the intermediate-refractive-index film 48 is smaller than the refractive index of the silicon substrate 59, and the refractive index of the protective film 43 is smaller than the refractive index of the intermediate-refractive-index film 48. A planarizing film 42 is disposed on the surface of the protective film 43 for planarizing surface irregularities of the protective film 43.

FIG. 2 of the accompanying drawings shows the solid-state imaging device disclosed in Japanese Patent Laid-Open Publication No. 152674/92. As shown in FIG. 2, the solid-state imaging device has a photodiode 75 and a vertical CCD 76 which are disposed in a surface layer of a silicon substrate 79 that is covered with a gate film 70. Gate electrodes 66 are disposed on the gate film 70 over the vertical CCD 76. An intermediate-refractive-index film 68 is disposed over surfaces and sides of ends of the gate electrodes 66 and the surface of the photodiode 75 with an insulating film interposed therebetween.

Light blocking films 64 are disposed over the surfaces of the gate electrodes 66 and the surfaces of the intermediate-refractive-index film 68 superposed on the ends of the gate electrodes 66 with an interlayer insulating film 65 interposed therebetween. The surfaces of the light blocking films 64 and the surface of the interlayer insulating film 65 over the photodiode 75 are covered with a protective film 63. The intermediate-refractive-index film 68 has a refractive index which is of a substantially intermediate value between the refractive index of a silicon oxide film used as the interlayer insulating film 65 and the protective film 63 and the refractive index of the silicon substrate 79. The refractive index of the intermediate-refractive-index film 68 is smaller than the refractive index of the silicon substrate 79, and the refractive index of the interlayer insulating film 65 and the protective film 63 is smaller than the refractive index of the intermediate-refractive-index film 68.

In the solid-state imaging device shown in FIG. 2, the ends of the intermediate-refractive-index film 68 overlap the ends of the gate electrodes 66. The thickness of the film between the sides of the ends of the gate electrodes 66 and the intermediate-refractive-index film 68 is greater than the thickness of the film between the intermediate-refractive-index film 68 and the photodiode 75. These dimensional features are effective to reduce any smearing of image signals generated by the solid-state imaging device.

In both the conventional solid-state imaging devices shown in FIGS. 1 and 2, the silicon substrate having the photodiode and a thin film such as the silicon oxide film on the photodiode have largely different refractive indices. In order to minimize light reflections from a boundary surface between the silicon substrate and the thin film, the intermediate-refractive-index film is used as a reflection-resistant film. As described above, the refractive index of the intermediate-refractive-index film is of a substantially intermediate value between the refractive index of the thin film such as the silicon oxide film on the silicon substrate and the refractive index of the silicon substrate. The intermediate-refractive-index film which is disposed on the surface of the silicon substrate either directly or with the insulating film interposed therebetween is effective to suppress light reflections from the semiconductor substrate. As a result, the sensitivity of the solid-state imaging device is increased.

With the solid-state imaging device disclosed in Japanese Patent Laid-Open Publication No. 206571/92, the intermediate-refractive-index film which covers the entire surface of the semiconductor substrate comprises a silicon nitride film which has a low hydrogen permeability. The intermediate-refractive-index film of a low hydrogen permeability which covers the entire surface of the semiconductor substrate fails to provide a hydrogen alloying effect. Hydrogen alloying occurs to reduce oxygen in the semiconductor substrate with hydrogen and remove the reduced oxygen from the semiconductor substrate. Upon hydrogen alloying, hydrogen passes through the silicon oxide film and tungsten. However, since hydrogen is blocked by the silicon nitride film as the intermediate-refractive-index film and does not reach the semiconductor substrate, no hydrogen alloying effect takes place. As a result, the solid-state imaging device produces an increased dark current.

The solid-state imaging device disclosed in Japanese Patent Laid-Open Publication No. 152674/92 has intermediate-refractive-index films associated with respective photodiodes. In the fabrication of the disclosed solid-state imaging device, it is necessary to deposit an intermediate-refractive-index film over the entire surface of the semiconductor substrate and thereafter etch away unwanted areas of the deposited intermediate-refractive-index film. Consequently, the process of fabricating the disclosed solid-state imaging device needs an additional step of etching away unwanted areas of the deposited intermediate-refractive-index film.

SUMMARY OF THE INVENTION

It is an object of the present invention to provide a solid-state imaging device including an intermediate-refractive-index film disposed over a photodiode, which solid-state imaging device is of high sensitivity and can be fabricated without impairing a hydrogen alloying effect.

Another object of the present invention is to provide a method of manufacturing a solid-state imaging device of high sensitivity according to a relatively simple fabrication process without impairing a hydrogen alloying effect.

To achieve the above objects, a solid-stage imaging device includes a semiconductor substrate having a sensor disposed in a surface layer on an entrance surface thereof for receiving incident light, and an intermediate-refractive-index film disposed on the entire entrance surface of the semiconductor substrate. The intermediate-refractive-index film has a refractive index lower than the semiconductor substrate and a low hydrogen permeability. The intermediate-refractive-index film has a hole. A thin film is formed on an entrance surface of the intermediate-refractive-index film, the thin film having a refractive index lower than the intermediate-refractive-index film and being permeable to hydrogen. In the solid-state imaging device, reflections of incident light applied through the thin film and the reflection-resistant film to the sensor of the semiconductor substrate are suppressed. The intermediate-refractive-index film serves as a reflection-resistant film, and the solid-state imaging device has a relatively high sensitivity. The hole in the intermediate-refractive-index film is effective in developing a hydrogen alloying effect. Upon hydrogen alloying after the thin film is formed on the intermediate-refractive-index film, hydrogen having passed through the thin film flows through the hole in the intermediate-refractive-index film and reaches the sensor of the semiconductor substrate. Therefore, oxygen in the semiconductor substrate is removed by the hydrogen supplied upon hydrogen alloying, with the result the solid-state imaging device will generate a relatively low dark current. As a consequence, the sensitivity of the solid-state imaging device is increased by the reflection-resistant film, and the dark current generated by the solid-state imaging device is reduced by the hydrogen alloying effect.

Furthermore, another solid-stage imaging device has a gate electrode disposed on an entrance surface of a semiconductor substrate, and an intermediate-refractive-index film disposed between the gate electrode and a light blocking film over an entrance surface of the gate electrode. A contact hole is defined through films, including the intermediate-refractive-index film, which are sandwiched between the gate electrode and the light blocking film, to electrically connect the gate electrode and the light blocking film to each other. An electrically conductive material permeable to hydrogen is filled in the contact hole. The electrically conductive material electrically connects the gate electrode and the light blocking film to each other. The gate electrode is backed up and connected by the light blocking film. The contact hole defined in the intermediate-refractive-index film provides an opening which serves as a hydrogen alloying hole for passage therethrough of hydrogen upon hydrogen alloying. Upon hydrogen alloying after the light blocking form is formed over the semiconductor substrate, hydrogen having passed through the light blocking film and the thin film flows through the electrically conductive material in the contact hole in the intermediate-refractive-index film and reaches the sensor of the semiconductor substrate. Therefore, the contact hole in the intermediate-refractive-index film serves as a hole for passage of hydrogen therethrough, allowing a hydrogen alloying effect to be developed sufficiently. As a consequence, the sensitivity of the solid-state imaging device is increased by the reflection-resistant film, and the dark current generated by the solid-state imaging device is reduced by the hydrogen alloying effect. In the solid-state imaging device with the gate electrode being backed up and connected by the light blocking film, since the contact hole serves as a hole for passage of hydrogen therethrough, there is no need to form a dedicated hydrogen alloying hole. Moreover, it is not necessary to etch away unwanted regions of the intermediate-refractive-index film except for the sensor. Since no etching step is needed to form the hydrogen alloying hole, the number of etching steps required is not increased.

In a method of manufacturing a solid-state imaging device according to the present invention, a hole is formed in an intermediate-refractive-index film disposed over an entrance surface of a semiconductor substrate and having a low hydrogen permeability. Upon hydrogen alloying after the thin film is formed on the intermediate-refractive-index film, hydrogen having passed through the thin film flows through the hole in the intermediate-refractive-index film and reaches the sensor of the semiconductor substrate. Therefore, oxygen in the semiconductor substrate is removed by the hydrogen supplied upon hydrogen alloying, with the result the solid-state imaging device will generate a relatively low dark current.

In another method of manufacturing a solid-state imaging device according to the present invention, a gate electrode for transferring charges from a sensor is backed up and connected. Specifically, a gate electrode is formed on a region of an entrance surface of a semiconductor substrate except for a region corresponding to the sensor, with an insulating film interposed between the gate electrode and the semiconductor substrate. An intermediate-refractive-index film is formed on the entrance surface of the semiconductor substrate and an entrance surface of the gate electrode either directly or with an insulating film interposed therebetween, the intermediate-refractive-index film having a refractive index lower than the semiconductor substrate and a low hydrogen permeability. A thin film is formed on an entrance surface of the intermediate-refractive-index film and has a refractive index lower than the intermediate-refractive-index film, the thin film being permeable to hydrogen. A contact hole is defined through the thin film and the intermediate-refractive-index film. The contact hole provides an opening in the intermediate-refractive-index film, which will serve as a hole for passage of hydrogen therethrough upon hydrogen alloying. An electrically conductive material permeable to hydrogen is filled in the contact hole. Thereafter, a light blocking film is formed on the region of the entrance surface of the thin film which corresponds to at least the gate electrode, the light blocking film being made of an electrically conductive material. The gate electrode is electrically connected to the light blocking film by the electrically conductive material in the contact hole, and backed up by the light blocking film. Therefore, hydrogen generated upon hydrogen alloying passes through the opening in the intermediate-refractive-index film and reaches the sensor of the semiconductor substrate, allowing a hydrogen alloying effect to be developed sufficiently. Since the contact hole serves as a hole for passage of hydrogen therethrough, there is no need to form a dedicated hydrogen alloying hole. Moreover, since it is not necessary to etch away unwanted regions of the intermediate-refractive-index film except for the sensor, the number of etching steps required is not increased.

Preferably, the intermediate-refractive-index film is made of silicon nitride, and the thin film is made of silicon oxide.

The above and other objects, features, and advantages of the present invention will become apparent from the following description with reference to the accompanying drawings which illustrate examples of the present invention.

DETAILED DESCRIPTION OF THE PREFERRED EMBODIMENTS

1st Embodiment

Figure 1:
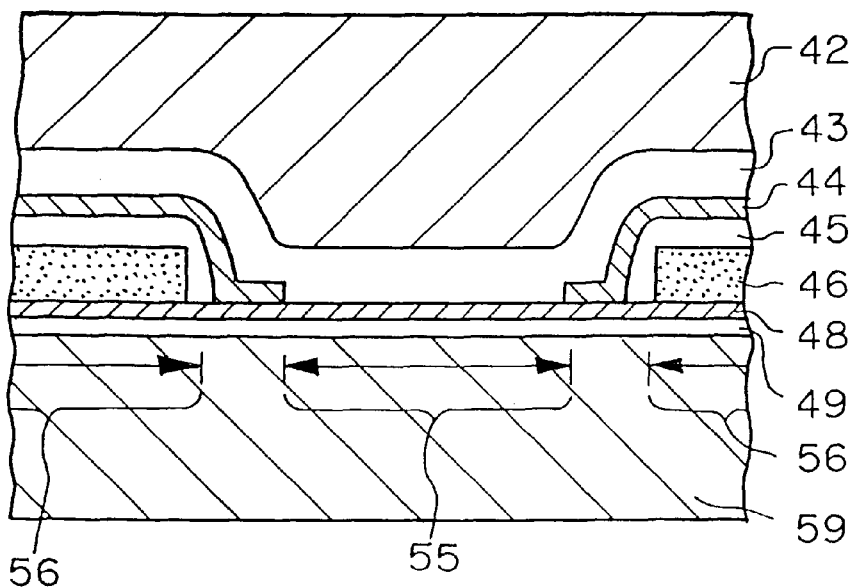
FIG. 1 is a fragmentary cross-sectional view of a conventional solid-state imaging device.
Figure 2:
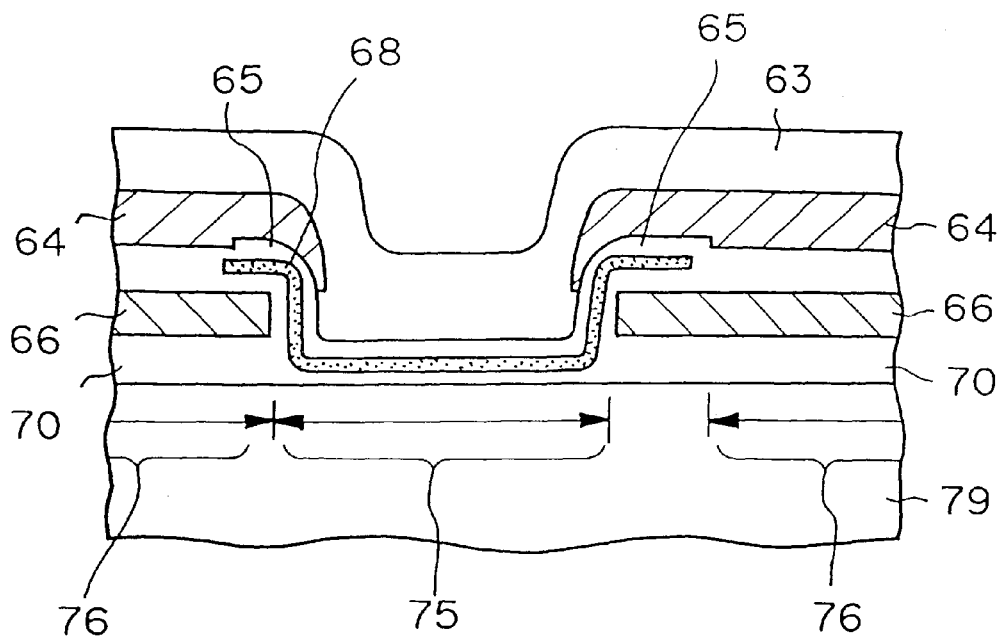
FIG. 2 is a fragmentary cross-sectional view of another conventional solid-state imaging device.
Figure 3:
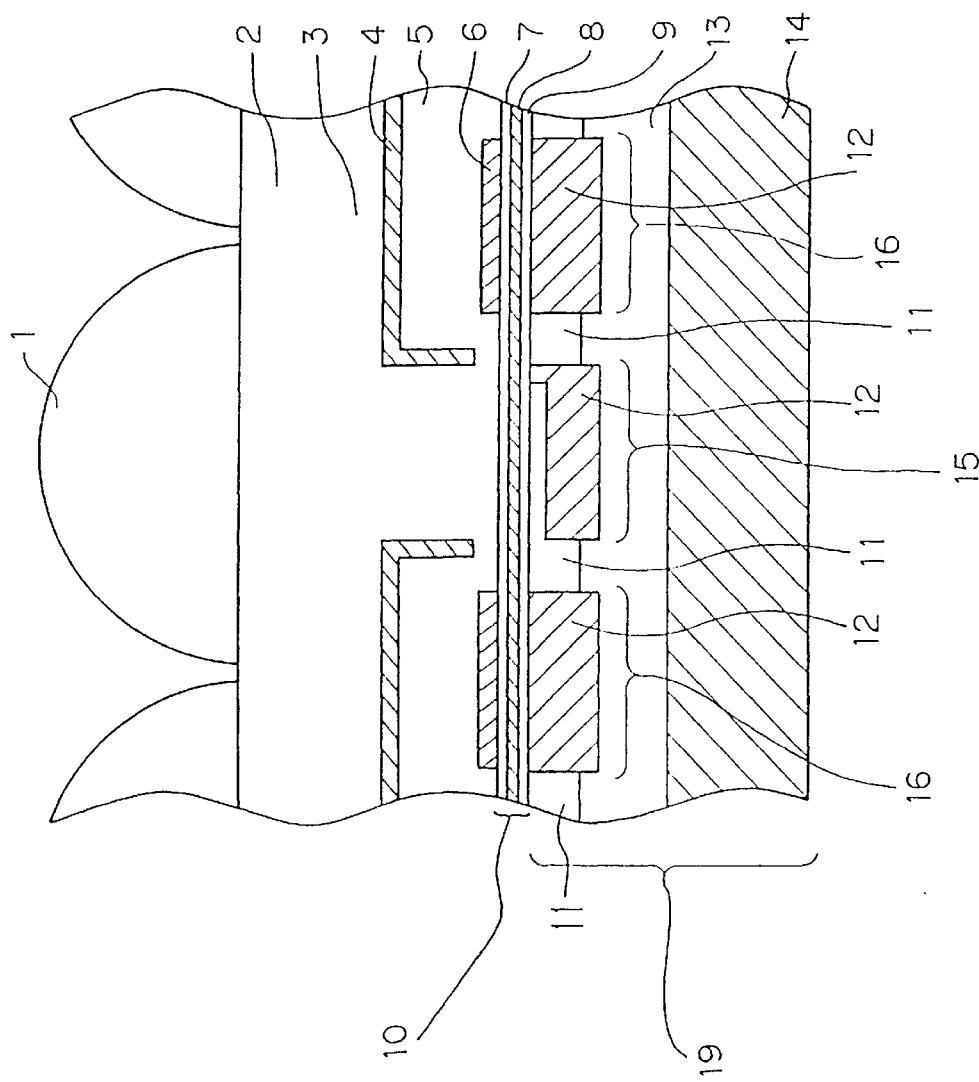
FIG. 3 is a fragmentary cross-sectional view of a solid-state imaging device according to a first embodiment of the present invention.

As shown in FIG. 3, a solid-state imaging device according to a first embodiment of the present invention has a silicon substrate 19 comprising a silicon layer (N-sub) 14, a P well 13 disposed on the surface of the silicon layer 14, a plurality of N wells 12 disposed on the surface of the P well 13, and a P$^+$ region 11 disposed on the surface of the P well 13 around the N wells 12. The N wells 12 are associated with respective photodiodes 15 as sensors and respective regions of a vertical CCD 16. The silicon substrate 19 has a surface near the photodiodes 15 which serve as an entrance surface to which incident light is applied. The photodiodes 15 and the vertical CCD 16 are disposed in a surface layer of the entrance surface of the silicon substrate 19.

The solid-state imaging device further includes a silicon oxide film 9, an intermediate-refractive-index film 8, and a silicon oxide film 7 which are disposed, successively in the order named, on the entrance surface of the silicon substrate 19. Gate electrodes 6 are disposed on an entrance surface of the silicon oxide film 7 over the respective regions of the vertical CCD 16. The silicon oxide film 9, the intermediate-refractive-index film 8, and the silicon oxide film 7 jointly serve as a three-layer gate ONO film 10 which is an insulating film between the gate electrodes 6 and the silicon substrate 19.

Light blocking films 4 are disposed over entrance surfaces of the gate electrodes 6 with an interlayer insulating film 5 interposed therebetween. The light blocking films 4 have ends extending toward the silicon substrate 19 to prevent light from entering the gate electrodes 6. A protective film 3 is disposed on the surfaces of the light blocking films 4 and the surfaces of the silicon oxide film 7 over the respective photodiodes 15. A planarizing film 2 is disposed on the surface of the protective film 3 for planarizing surface irregularities of the protective film 3. The planarizing film 2 provides a flat surface on the films that are disposed on the silicon substrate 19. A microlens array 1 is disposed on the flat surface of the planarizing film 2, the microlens array 1 comprising microlenses positioned respectively over the respective photodiodes 15.

The silicon substrate 19 has a refractive index of about 3.5 with respect to light having a wavelength of 550 nm. The intermediate-refractive-index film 8 comprises a silicon nitride film having a refractive index of about 2.0 with respect to light having a wavelength of 550 nm. All the films, other than the intermediate-refractive-index film 8, disposed on the entrance surfaces of the photodiodes 15 have a refractive index of about 1.5 with respect to light having a wavelength of 550 nm.

The thicknesses of the silicon oxide film 9 and the intermediate-refractive-index film 8 are selected such that light applied through these films 8, 9 to the photodiodes 15 will be reflected with a low reflectance from the silicon substrate 19, and hence has a relatively large intensity falling on the photodiodes 15. Therefore, the silicon oxide film 9 and the intermediate-refractive-index film 8 serve as a reflection-resistant film over the photodiodes 15. The intermediate-refractive-index film 8 may comprise a tantalum oxide film, a titanium oxide film, or a strontium titanate film rather than a silicon nitride film, so as to serve as a reflection-resistant film. The silicon oxide film 9 interposed between the intermediate-refractive-index film 8 and the silicon substrate 19 is employed to achieve better processing matching between the interfaces of the silicon substrate 19 and the silicon oxide film 9. However, the silicon oxide film 9 may be dispensed with. In this embodiment, the silicon oxide film 9 has a thickness of 20 nm, and the intermediate-refractive-index film 8 has a thickness of 30 nm. Although not shown in FIG. 3, the intermediate-refractive-index film 8 has hydrogen alloying holes (described later on with reference to FIG. 8) for passing hydrogen therethrough upon hydrogen alloying.

As described above, the silicon substrate 19 has a refractive index of about 3.5, and the silicon oxide films 7, 9, the protective film 3, and the planarizing film 2 have a refractive index of about 1.5. If the intermediate-refractive-index film 8 were not present, then a film whose refractive index would largely be different from the refractive index of the silicon substrate 19 would be disposed on the silicon substrate 19. In such a case, a large amount of incident light applied to the photodiode 15 would be reflected by the boundary surface between the silicon substrate 19 and the film on the silicon substrate 19, resulting in a reduction in the amount of light passing through the boundary surface. According to this embodiment, however, the intermediate-refractive-index film 8 whose thickness is 30 nm and whose refractive index is about 2.0 is disposed on the silicon substrate 19 with the silicon oxide film 9 of a thickness of 20 nm being interposed therebetween. Therefore, light reflections from the boundary surface between the silicon substrate 19 and the silicon oxide film 9 are reduced, so that the intensity of light applied to the photodiode 15 is increased. As a consequence, the sensitivity of the solid-state imaging device is increased.

FIGS. 4A, 4B, 5A, 5B, 6A, and 6B show the reflectance of an entire film assembly on the silicon substrate, as it varies with the wavelength of incident light applied to the silicon oxide film in a direction perpendicular to the silicon substrate, in each of various specimens of the solid-state imaging device shown in FIG. 3. In each of the specimens, a silicon oxide film is disposed on a silicon substrate with an intermediate-refractive-index film interposed therebetween. The intermediate-refractive-index films of the specimens have different widths. The reflectance of the entire film assembly is the total reflectance of all films that are present between the air and the silicon substrate. If it is assumed that the films do not absorb light that passes therethrough, then a proportion indicated by (1—the reflectance of all the films) of incident light applied to the solid-state imaging device passes through the films to the surface of the silicon substrate.

The silicon oxide film on the intermediate-refractive-index film has a thickness of about 4 nm, and is considered not to interfere with visible light. The microlens array 1 has a refractive index which is essentially the same as the refractive index of the silicon oxide film. It is therefore assumed that the combination of the silicon oxide film and the microlenses is replaced with a silicon oxide film, and a silicon oxide film having an infinite thickness is disposed on the intermediate-refractive-index film.

Figure 4A:
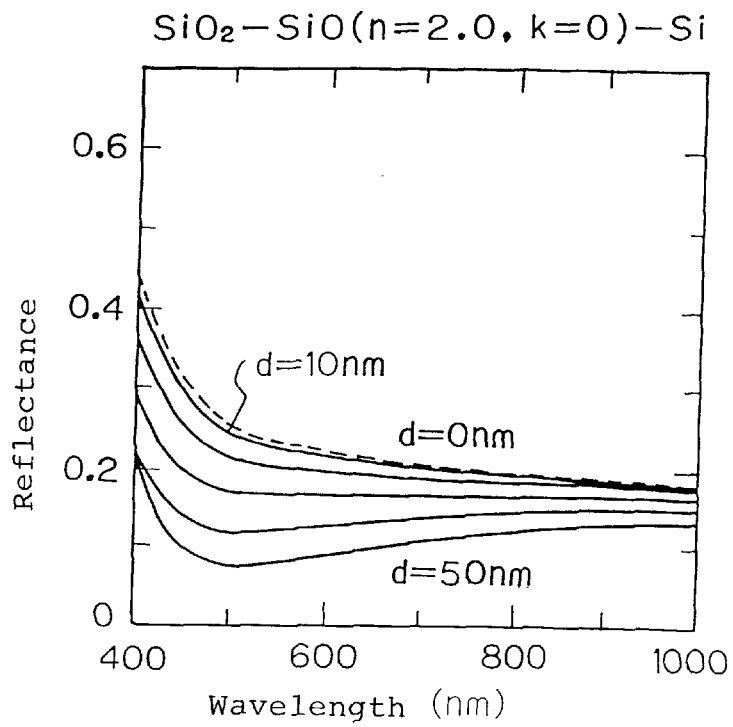
FIGS. 4A, 4B, 5A, 5B, 6A, and 6B are diagrams showing the reflectance of an entire film assembly on a silicon substrate, as it varies with the wavelength of incident light applied to a silicon oxide film in a direction perpendicular to the silicon substrate, in each of various specimens of the solid-state imaging device shown in FIG. 3, the specimens having intermediate-refractive-index films of different thicknesses.
Figure 4B:
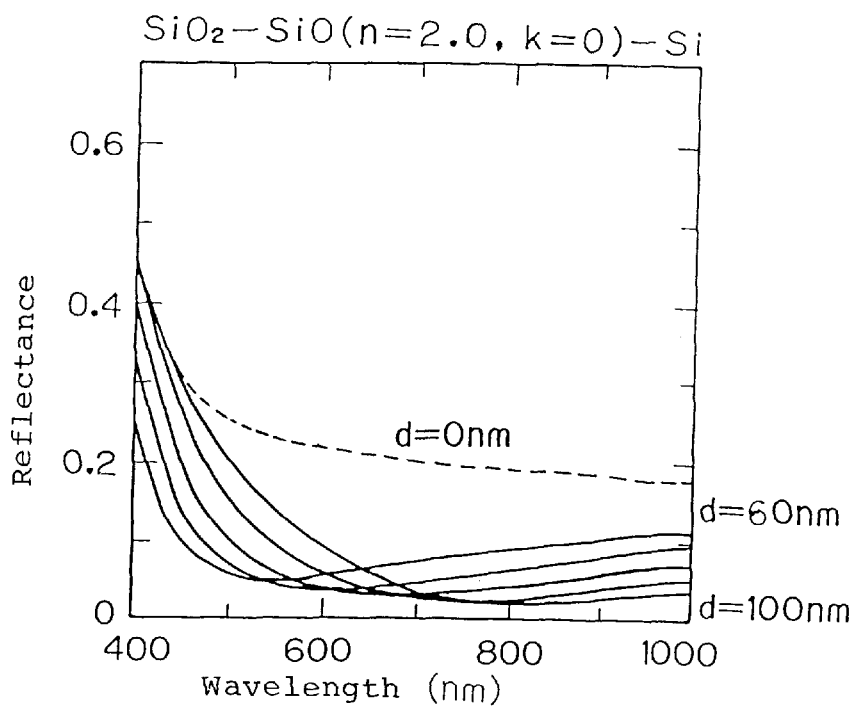
Figure 5A:
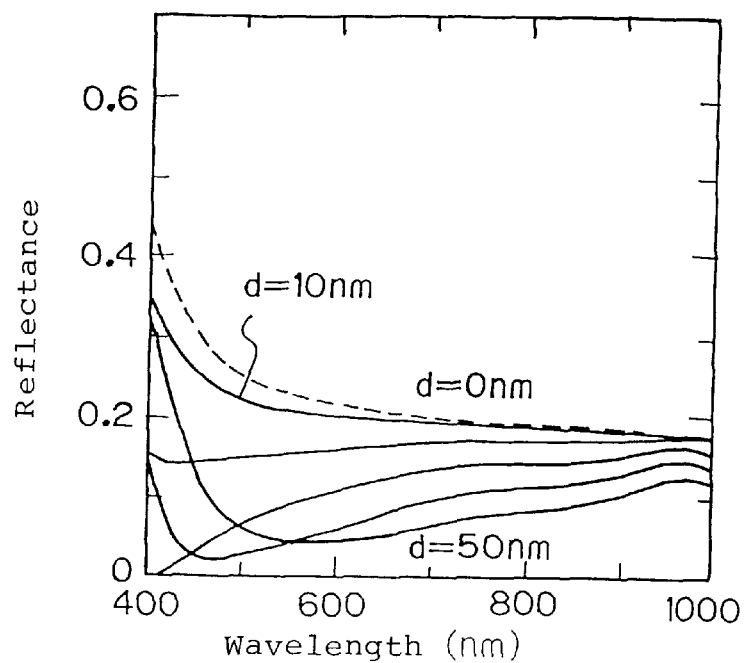
Figure 5B:
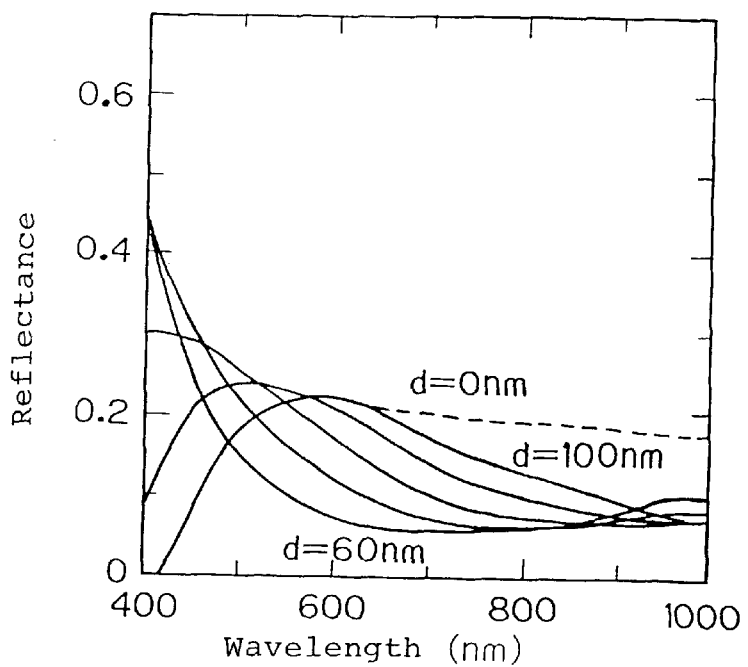
Figure 6A:
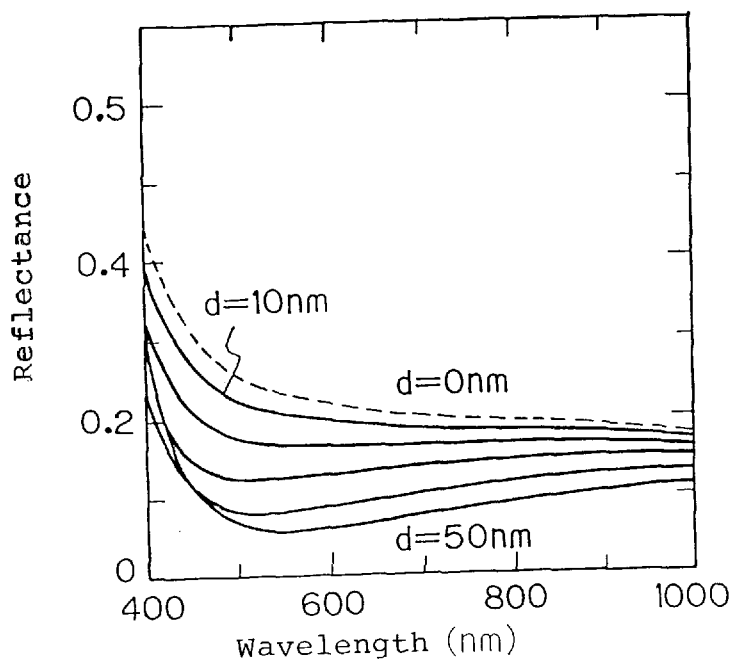
Figure 6B:
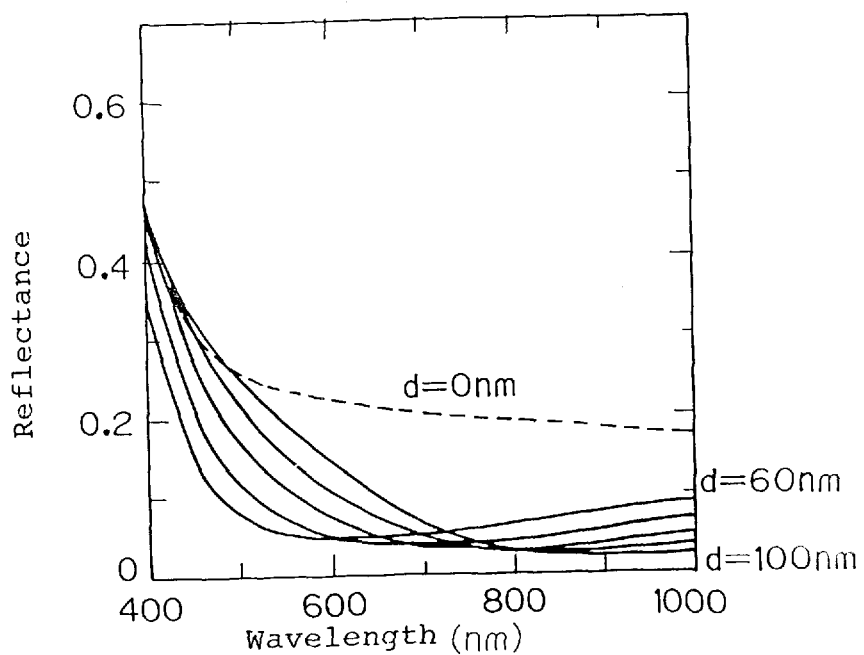

In FIGS. 4A, 4B, 5A, 5B, 6A, and 6B, the horizontal axis represents the wavelength (nm) of incident light and the vertical axis the reflectance of the entire film assembly. Furthermore, the dotted-line curve in each of FIGS. 4A, 4B, 5A, 5B, 6A, and 6B shows the relationship between the wavelength of incident light and the reflectance of the entire film assembly in a specimen that is free of any intermediate-refractive-index film. In FIGS. 4A, 5A, and 6A, the solid-line curves show the relationship between the wavelength of incident light and the reflectance of the entire film assembly in respective specimens whose intermediate-refractive-index films have thicknesses ranging from 10 nm to 50 nm at intervals of 10 nm. In FIGS. 4B, 5B, and 6B, the solid-line curves show the relationship between the wavelength of incident light and the reflectance of the entire film assembly in respective specimens whose intermediate-refractive-index films have thicknesses ranging from 60 nm to 100 nm at intervals of 10 nm.

In each of the specimens shown in FIGS. 4A and 4B, the intermediate-refractive-index film is made of a material which has a refractive index of about 2.0 and does not absorb light. For example, the intermediate-refractive-index film is made of SiO, silicon nitride, $TaO_2$, or $TiO_2$. It can be seen from FIGS. 4A and 4B that the reflectance of the entire film assembly can be lowered by adjusting the thickness of the intermediate-refractive-index film depending on the wavelength of incident light.

In each of the specimens shown in FIGS. 5A and 5B, the intermediate-refractive-index film is made of a material which has a refractive index of about 3.0 and does not absorb light. For example, the intermediate-refractive-index film may be made of $SrTiO_3$. It can be seen from FIGS. 5A and 5B that the reflectance of the entire film assembly can be lowered with respect to light in a low wavelength range by adjusting the thickness of the intermediate-refractive-index film.

In each of the specimens shown in FIGS. 6A and 6B, an intermediate-refractive-index film is disposed on a silicon substrate with a silicon oxide film of a thickness of 10 nm being interposed therebetween, and a silicon oxide film is disposed on the intermediate-refractive-index film. This arrangement provides a good interfacial condition between the silicon substrate and the film on the silicon substrate. In each of the specimens, the intermediate-refractive-index film is made of a material which has a refractive index of about 2.0 and does not absorb light. It can be seen from FIGS. 6A and 6B that the reflectance of the entire film assembly can be lowered by adjusting the thickness of the intermediate-refractive-index film.

The intermediate-refractive-index film lying over the silicon substrate may not be a single-layer film, but may be a multiple-layer film. It is also possible with this modification to reduce the reflectance of the entire film assembly on the silicon substrate by adjusting the thickness of the intermediate-refractive-index film.

According to this embodiment, as described above, in the case where a silicon oxide film whose refractive index is largely different from the refractive index of the silicon substrate is disposed on the silicon substrate, an intermediate-refractive-index film whose refractive index is of an intermediate value between the refractive index of the silicon substrate and the refractive index of the silicon oxide film is placed between the silicon substrate and the silicon oxide film. In addition, the refractive index and the thickness of the intermediate-refractive-index film are adjusted in the manner described above with reference to FIGS. 4A, 4B, 5A, 5B, 6A, and 6B. In this manner, the reflection of incident light that is applied through the films on the silicon substrate to the photodiode in the silicon substrate can be reduced. The reflection of incident light that is applied to the photodiode can also be reduced by a silicon oxide film with an adjusted thickness which is disposed between the silicon substrate and the intermediate-refractive-index film.

Figure 7:
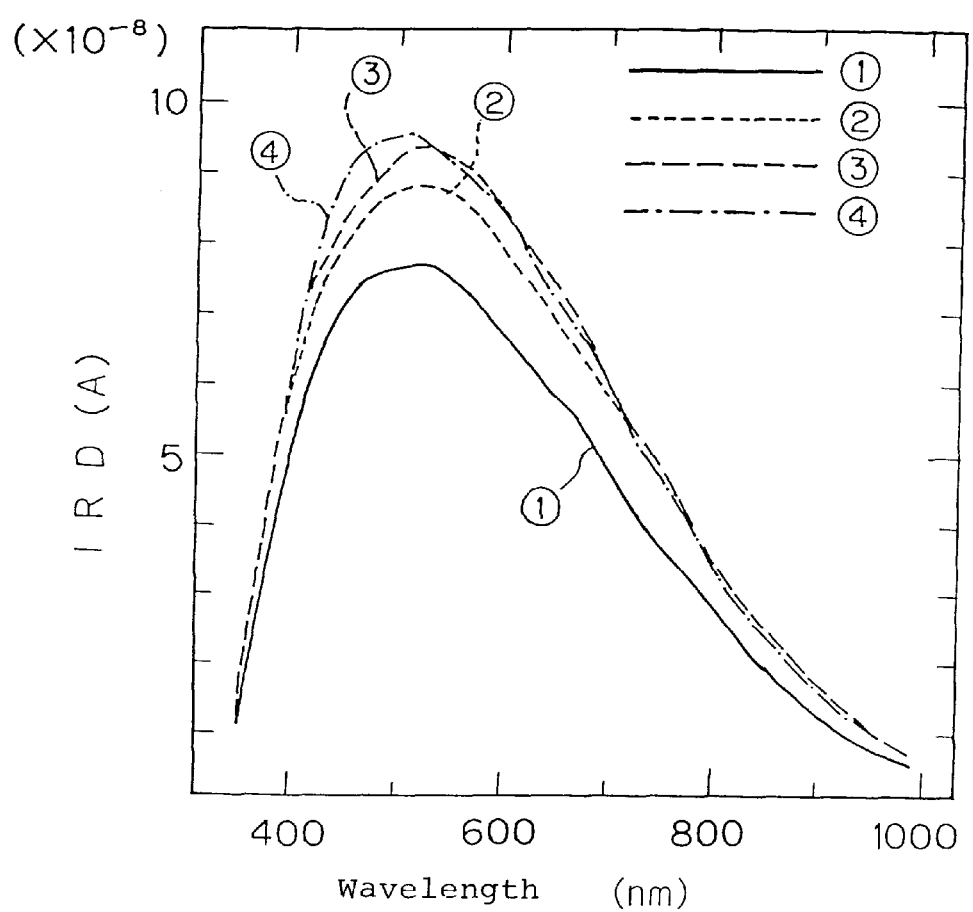
FIG. 7 is a diagram showing sensitivities of specimens of the solid-state imaging device shown in FIG. 3.

FIG. 7 shows sensitivities of specimens of the solid-state imaging device shown in FIG. 3. In FIG. 7, the horizontal axis represents the wavelength (nm) of incident light applied to the photodiode 15 and the vertical axis the sensitivity (A) of the solid-state imaging device. The solid-line curve ① in FIG. 7 shows the sensitivity of the specimen which is free of the intermediate-refractive-index film 8 and the silicon oxide film 9 as the reflection-resistant film. The dotted-line curve ② in FIG. 7 shows the sensitivity of the specimen in which the silicon oxide film 9 has a thickness of 20 nm and the intermediate-refractive-index film 8 has a thickness of 20 nm. The dotted-line curve ③ in FIG. 7 shows the sensitivity of the specimen in which the silicon oxide film 9 has a thickness of 20 nm and the intermediate-refractive-index film 8 has a thickness of 30 nm. The dot-and-dash-line curve ④ in FIG. 7 shows the sensitivity of the specimen in which the silicon oxide film 9 has a thickness of 20 nm and the intermediate-refractive-index film 8 has a thickness of 40 nm.

As shown in FIG. 7, the specimens with the reflection-resistant film as indicated by the curves ②, ③, and ④ have their sensitivities about 10% greater than the sensitivity of the specimen free of the reflection-resistant film as indicated by the curve ①.

Figure 8:
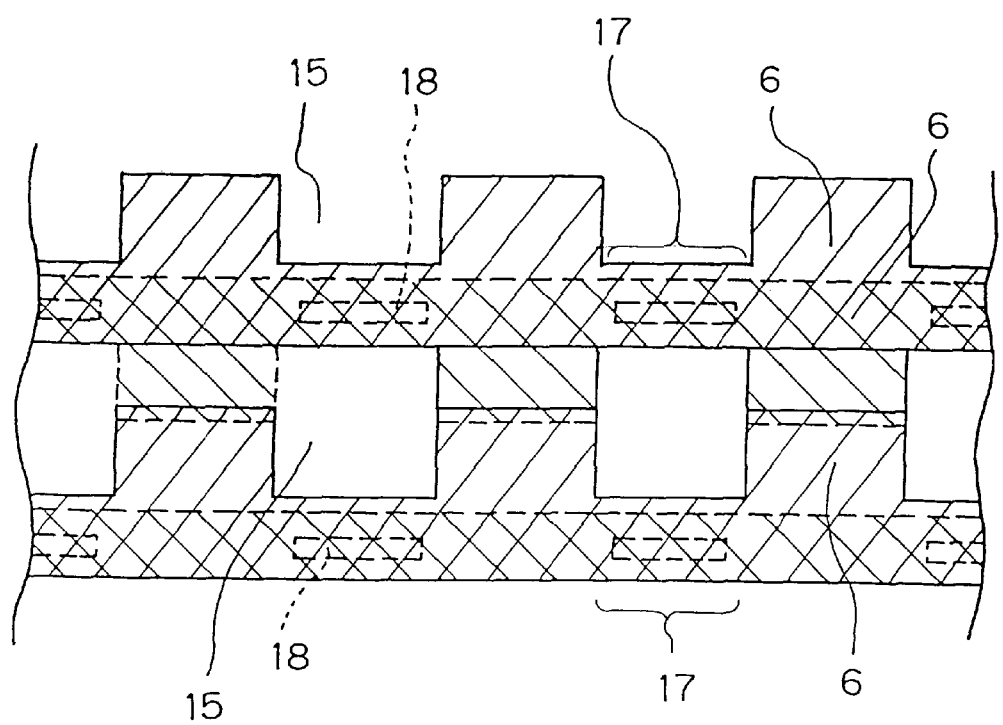
FIG. 8 is a fragmentary plan view of the solid-state imaging device shown in FIG. 3, with a microlens array, a planarizing film, a protective film, a light blocking film, and an interlayer insulating film being omitted from illustration.

Hydrogen alloying holes defined in the intermediate-refractive-index film 8 will be described below. FIG. 8 shows in plan the solid-state imaging device illustrated in FIG. 3, with the microlens array 1, the planarizing film 2, the protective film 3, the light blocking film 4, and the interlayer insulating film 5 being omitted from illustration. FIG. 8 illustrates a layout of hydrogen alloying holes defined in the intermediate-refractive-index film 8.

As shown in FIG. 8, the gate electrodes 6 are disposed around the photodiodes 15 and interconnected by gate electrode bridges 17. Hydrogen alloying holes 18 which are of an elongate slot-like shape are defined in the regions of the intermediate-refractive-index film 8 which underlie the gate electrode bridges 17.

As described above, the solid-state imaging device has the hydrogen alloying holes 18 defined in the intermediate-refractive-index film 8 which is a silicon nitride film. When hydrogen alloying is performed after the silicon oxide film 7 is deposited on the intermediate-refractive-index film 8, hydrogen that has passed through the silicon oxide film 7 passes through the hydrogen alloying holes 18 and then through the silicon oxide film 9, and reaches the entrance surface of the silicon substrate 19. The hydrogen that has reached the silicon substrate 19 reduces oxygen in the silicon substrate 19 to remove the oxygen from the silicon substrate 19. Therefore, the hydrogen alloying effect is not impaired, and a dark current is suppressed in the solid-state imaging device. If the hydrogen alloying holes 18 are spaced apart at intervals of 10 nm, then the hydrogen alloying effect is sufficiently developed.

A process of manufacturing the solid-state imaging device according to the first embodiment shown in FIG. 3 will be described below with reference to FIGS. 9A, 9B, 9C, and 9D.

Figure 9A:
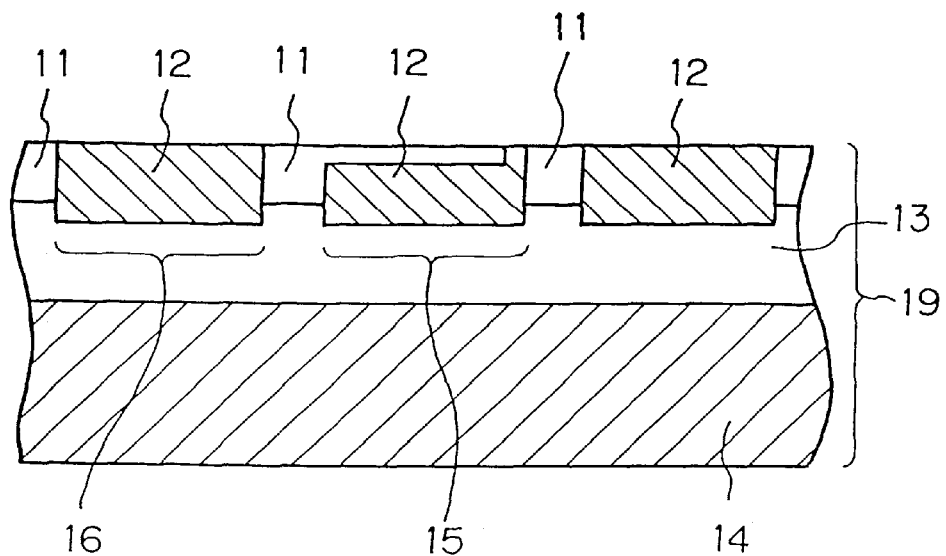
FIGS. 9A, 9B, 9C, and 9D are fragmentary cross-sectional views illustrative of a process of manufacturing the solid-state imaging device shown in FIG. 3.

As shown in FIG. 9A, a P well 13 is formed in one surface of a silicon layer 14. Then, N wells 12 and a P+ region 11 are formed on the surface of the P well 13 respectively over photodiodes 15 and regions of a vertical CCD 16. The silicon layer 14, the P well 13, the N wells 12, and the P+ region 11 jointly make up a silicon substrate 19.

Figure 9B:
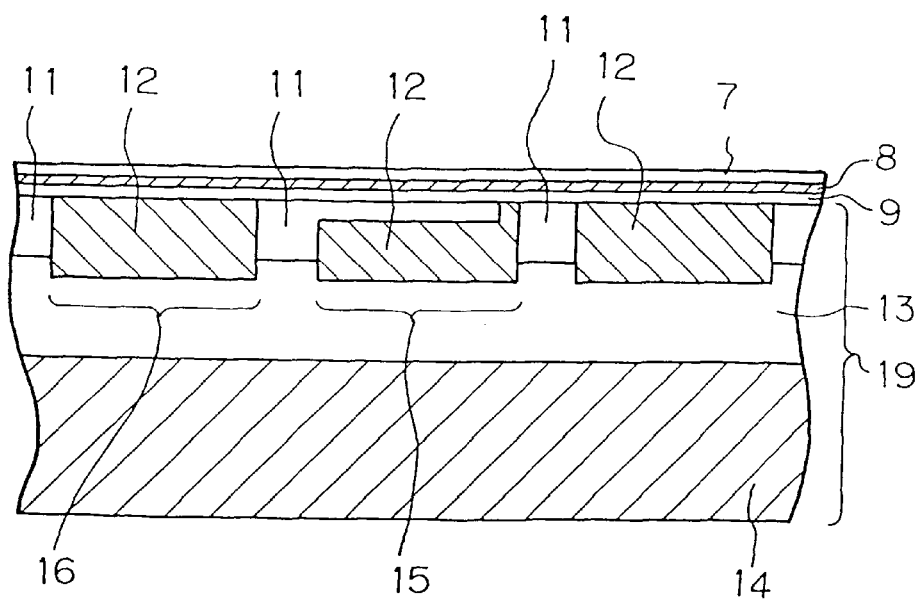

Then, as shown in FIG. 9B, a silicon oxide film 9 is formed on the surface of the silicon substrate 19 where the N wells 12 and the P+ region 11 are formed. An intermediate-refractive-index film 8 which comprises a silicon nitride film is formed on the surface of the silicon oxide film 9. Although not shown in FIG. 9B, hydrogen alloying holes 18 described above with reference to FIG. 8 are formed in the intermediate-refractive-index film 8. A process of forming the hydrogen alloying holes 18 will be described later on with reference to FIGS. 10A, 10B, 10C, and 10D. Thereafter, a silicon nitride film 7 is formed on the surface of the intermediate-refractive-index film 8.

Figure 9C:
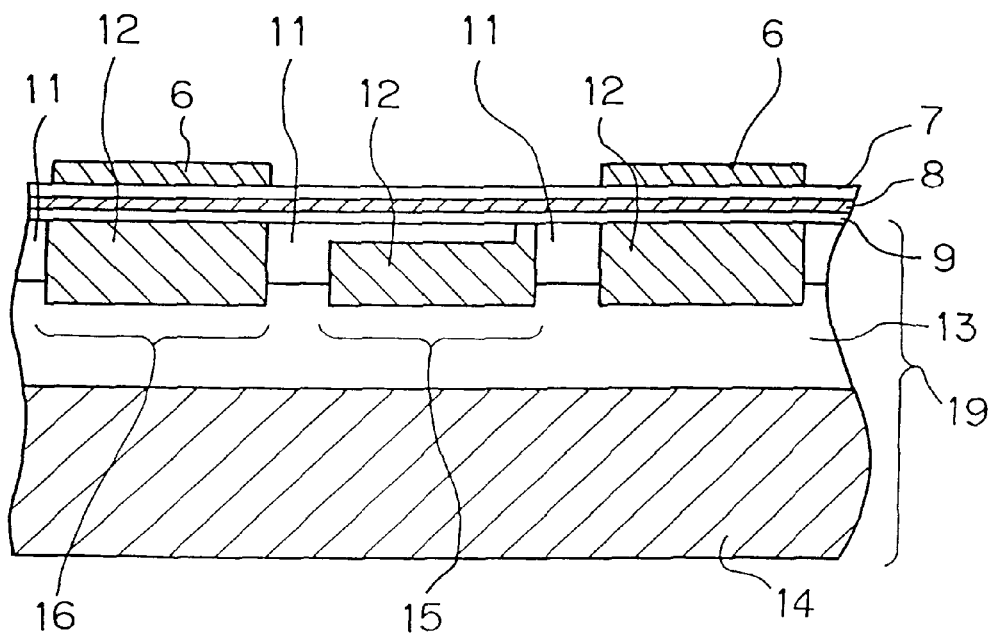

As shown in FIG. 9C, gate electrodes 6 are formed on the surface of the silicon nitride film 7 respectively over the regions of the vertical CCD 16.

Figure 9D:
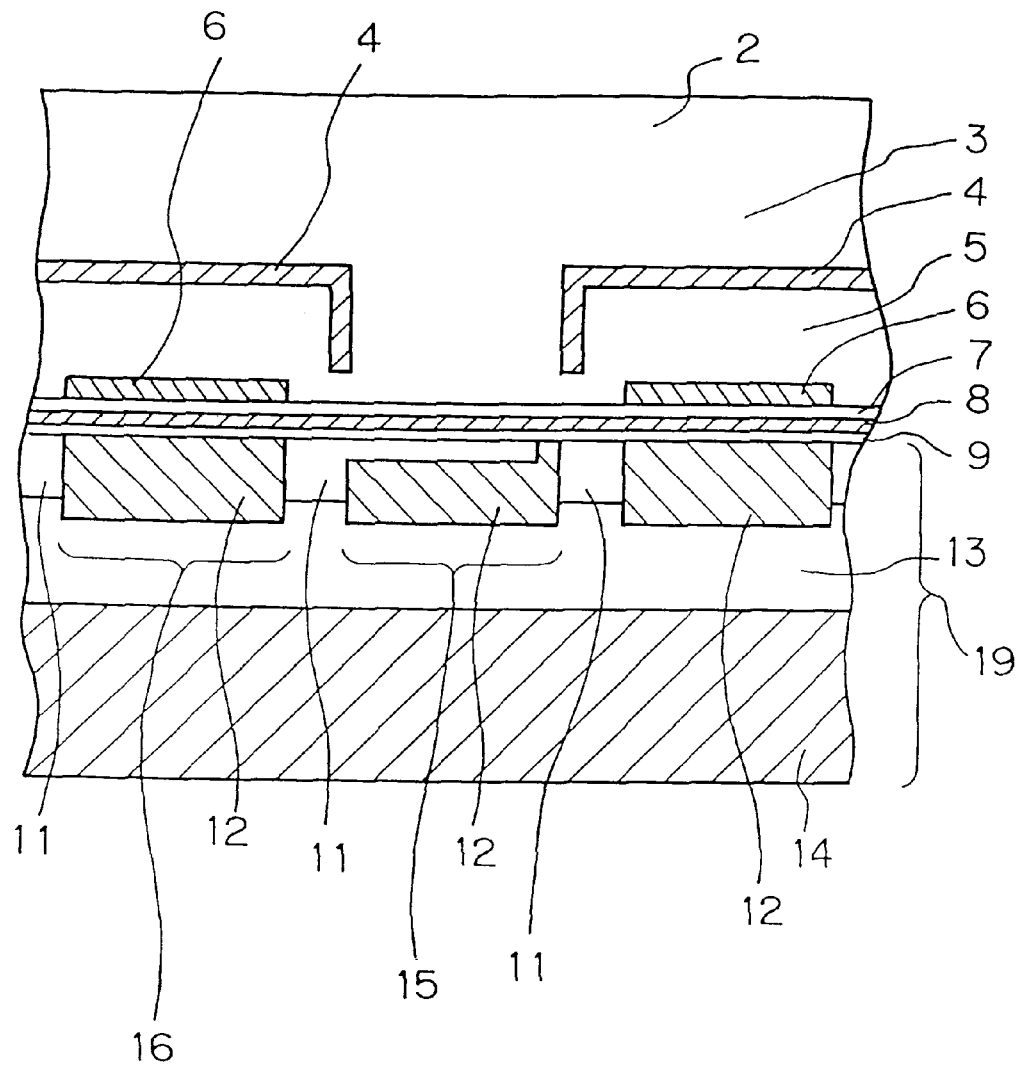

Then, as shown in FIG. 9D, light blocking films 4 are formed over the surfaces of the gate electrodes 6 and regions around the gate electrodes 6, with an interlayer insulating film 5 interposed therebetween. The interlayer insulating film 5 is also disposed on the surfaces of the silicon oxide film 7 over the photodiodes 15. Thereafter, a protective film 3 is formed on the surfaces of the light blocking films 4 and the surfaces of the silicon oxide film 7 over the respective photodiodes 15. A planarizing film 2 is formed on the surface of the protective film 3 for planarizing surface irregularities of the protective film 3.

A microlens array 1 is formed on the flat surface of the planarizing film 2, the microlens array 1 comprising microlenses positioned respectively over the respective photodiodes 15.

FIGS. 10A, 10B, 10C, and 10D are illustrative of a process of forming hydrogen alloying holes 18 shown in FIG. 8. The hydrogen alloying holes 18 which are defined in the regions of the intermediate-refractive-index film 8 which underlie the gate electrode bridges 17 are formed according to the process shown in FIGS. 10A, 10B, 10C, and 10D.

Figure 10A:
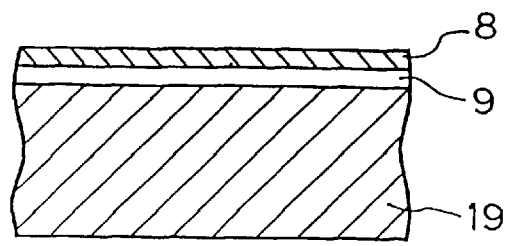
FIGS. 10A, 10B, 10C, and 10D are fragmentary cross-sectional views illustrative of a process of forming hydrogen alloying holes shown in FIG. 8.

As shown in FIG. 10A, a silicon oxide film 9 is formed on the entire surface of the silicon substrate 19 near the photodiodes 15 shown in FIG. 3, and then an intermediate-refractive-index film 8 is formed on the entire surface of the silicon oxide film 9.

Figure 10B:
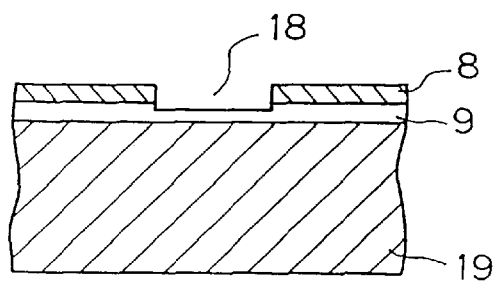

Thereafter, as shown in FIG. 10B, a portion of the intermediate-refractive-index film 8 which corresponds to a gate electrode bridge 17, to be formed subsequently, is etched away, thus forming a hydrogen alloying hole 18 in the intermediate-refractive-index film 8.

Figure 10C:
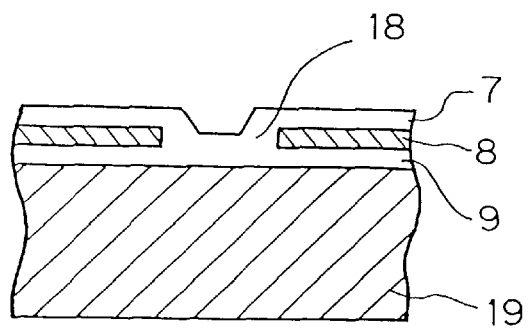

Then, as shown in FIG. 10C, a silicon oxide film 7 is formed on the surface of the intermediate-refractive-index film 8 and in the hydrogen alloying hole 18.

Figure 10D:
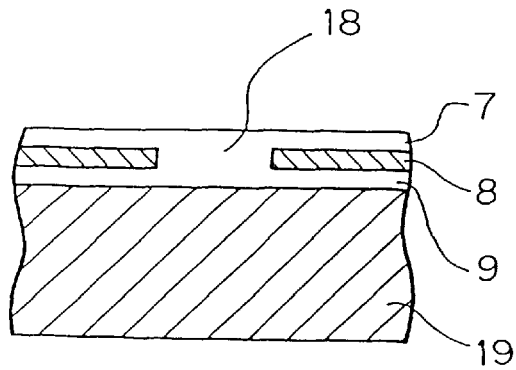

As shown in FIG. 10D, the surface of the silicon oxide film 7 is lightly oxidized to cover the recess in the silicon oxide film 7. In this fashion, the hydrogen alloying hole 18 is defined in the intermediate-refractive-index film 8 which is a silicon nitride film. In order to develop a sufficient hydrogen alloying effect, hydrogen alloying holes 18 should preferably be defined at intervals of 10 nm.

2nd Embodiment

Figure 11:
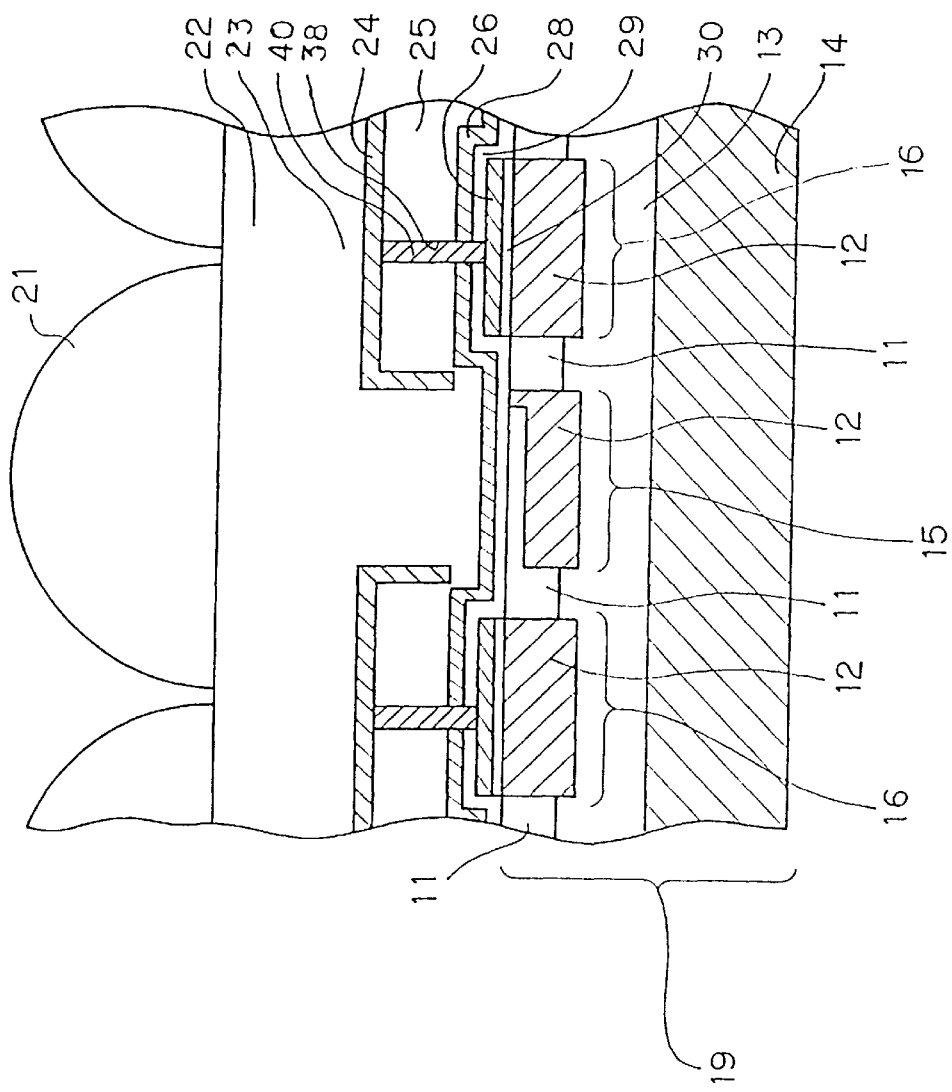
FIG. 11 is a fragmentary cross-sectional view of a solid-state imaging device according to a second embodiment of the present invention.

FIG. 11 shows a solid-state imaging device according to a second embodiment of the present invention. The solid-state imaging device according to the second embodiment differs from the solid-state imaging device according to the first embodiment as to the arrangement of films disposed on a silicon substrate, gate electrodes are backed up by and connected to light blocking films, and no hydrogen alloying holes are defined in regions of an intermediate-refractive-index film which underlie the gate electrode bridges. Those parts of the solid-state imaging device according to the second embodiment which are identical to those of the solid-state imaging device according to the first embodiment are denoted by identical reference numerals. Basically, those parts of the solid-state imaging device according to the second embodiment which are different from those of the solid-state imaging device according to the first embodiment will be described below.

As shown in FIG. 11, a photodiode 15 as a sensor and a vertical CCD 16 are disposed in a surface layer of an entrance surface of a silicon substrate 19. Gate electrodes 26 are disposed over the surface of the silicon substrate 19 with respective gate ONO films 30 interposed therebetween over respective regions of the vertical CCD 16. Each of the gate ONO films 30 is of a three-layer structure comprising a silicon nitride film and two silicon oxide films positioned one on each side of the silicon nitride film. According to the second embodiment, no gate ONO film 30 is positioned on the surface of the silicon substrate 19 over the photodiode 15.

A silicon oxide film 29 is disposed on the surfaces of the gate electrodes 26, the sides of the gate electrodes 26 and the gate ONO films 30, and the entrance surface of the silicon substrate 19. An intermediate-refractive-index film 28 is disposed on the entrance surface of the silicon oxide film 29. Light blocking films 24 are disposed over the surface of the intermediate-refractive-index film 28 over the surfaces of the gate electrodes 26 and regions around the gate electrodes 26 with an interlayer insulating film 25 interposed therebetween. The light blocking films 24 have ends extending toward the silicon substrate 19 to prevent incident light from entering the gate electrodes 26.

The light blocking films 24 are made of an electrically conductive material. According to the second embodiment, the light blocking films 24 are used as low-resistance film interconnections for backing up and connecting the gate electrodes 26. Contact holes 38 are provided to allow the light blocking films 24 to back up and connect the gate electrodes 26. The contact holes 38 extend through those regions of the interlayer insulating film 25, the intermediate-refractive-index film 28, and the silicon oxide film 29 which are sandwiched between the gate electrodes 26 and the light blocking films 24 and correspond to the gate electrodes 26. Therefore, the contact holes 38 extend from the entrance surface of the interlayer insulating film 25 to the entrance surface of the gate electrodes 26. The contact holes 38 are filled with an electrically conductive material 40 such as tungsten which is permeable to hydrogen. The electrically conductive material 40 electrically connects the gate electrodes 26 and the light blocking films 24 to each other.

A protective film 23 is disposed on the surfaces of the light blocking films 24 and the surfaces of the silicon substrate 19 over the respective photodiodes 15. A planarizing film 22 is disposed on the surface of the protective film 23 for planarizing surface irregularities of the protective film 23. The planarizing film 22 provides a flat surface on the films that are disposed on the silicon substrate 19. A microlens array 21 is disposed on the flat surface of the planarizing film 22, the microlens array 21 comprising microlenses positioned respectively over the respective photodiodes 15.

As with the first embodiment, the silicon substrate 19 has a refractive index of about 3.5 with respect to light having a wavelength of 550 nm. The intermediate-refractive-index film 28 comprises a silicon nitride film having a refractive index of about 2.0 with respect to light having a wavelength of 550 nm. The films, other than the intermediate-refractive-index film 28, disposed on the entrance surfaces of the photodiodes 15 have a refractive index of about 1.5 with respect to light having a wavelength of 550 nm.

The thicknesses of the silicon oxide film 29 and the intermediate-refractive-index film 28 are selected such that light applied through these films 28, 29 to the photodiodes 15 will be reflected with a low reflectance from the silicon substrate 19, and hence has a relatively large intensity falling on the photodiodes 15. In the second embodiment, the silicon oxide film 29 has a thickness of 20 nm, and the intermediate-refractive-index film 28 has a thickness of 30 nm.

A process of manufacturing the solid-state imaging device according to the second embodiment will be described below with reference to FIGS. 12A, 12B, 12C, and 12D.

FIGS. 12A, 12B, 12C, and 12D illustrate in cross section the process of manufacturing the solid-state imaging device according to the second embodiment. In FIGS. 12A, 12B, 12C, and 12D, films are formed on the entrance surface of the silicon substrate 19. The films on the entrance surface of the silicon substrate 19 are formed according to steps shown in FIGS. 12A, 12B, 12C, and 12D.

Figure 12A:
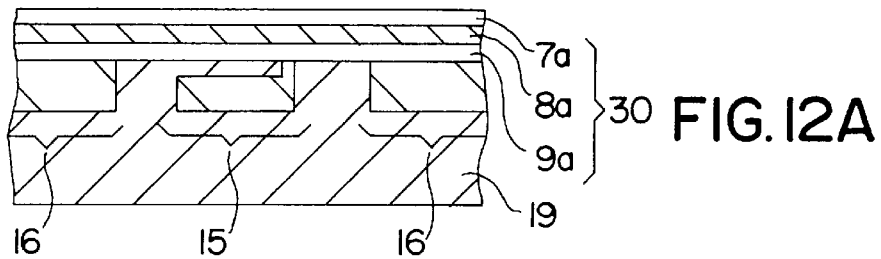
FIGS. 12A, 12B, 12C, and 12D are fragmentary cross-sectional views illustrative of a process of manufacturing the solid-state imaging device shown in FIG. 11.

As shown in FIG. 12A, a silicon oxide film 9a, a silicon nitride film 8a, and a silicon oxide film 7a are formed, successively in the order named, on the entrance surface of the silicon substrate 19. The silicon oxide film 9a, the silicon nitride film 8a, and the silicon oxide film 7a jointly serve as a gate ONO film 30 which will be sandwiched between the N wells 12 and the gate electrodes 26.

Figure 12B:
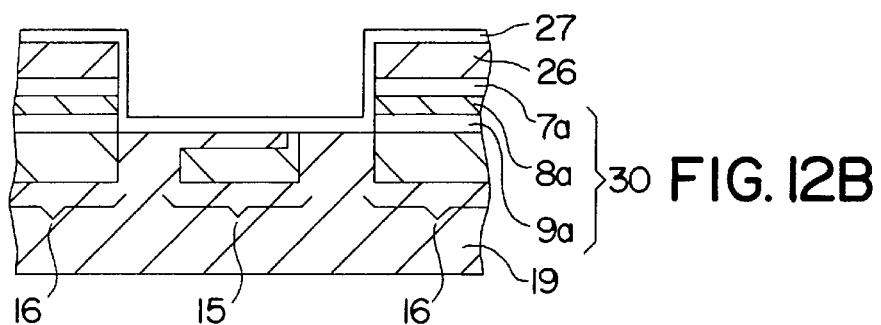

As shown in FIG. 12B, a layer which will serve the gate electrodes 26 is formed on the silicon oxide film 7a. Then, regions of the gate ONO film 30 and the gate electrodes 26 except for those corresponding to the vertical CCD 16 are etched away. The films on the photodiodes 15 are completely removed or only a thin silicon oxide film is left on the photodiodes 15 by drying etching and refreshing. A silicon oxide film 27 is formed on the exposed silicon substrate 19 from which the films are removed and on the surfaces of the gate electrodes 26, by CVD (Chemical Vapor Deposition).

Figure 12C:
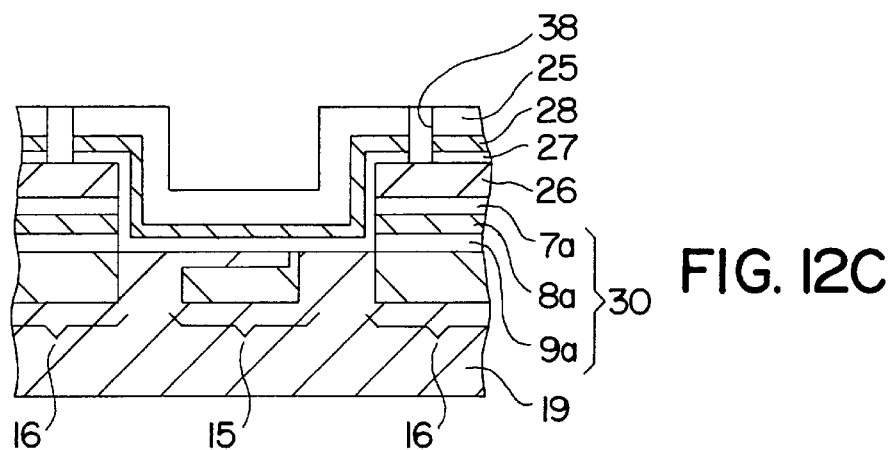

As shown in FIG. 12C, an intermediate-refractive-index film 28 which comprises a silicon nitride film is formed on the surface of the silicon oxide film 27. In the case where the insulating film between the gate electrodes 26 and the silicon substrate 19 is the gate ONO film 30 comprising the silicon nitride film and the silicon oxide film according to this embodiment, if the silicon oxide film 27 is formed by thermal oxidation rather than CVD, then no gap is created between the intermediate-refractive-index film 28 and the silicon nitride film 8a, with the result that no hydrogen alloy effect will be developed. Therefore, if the insulating film between the gate electrodes 26 and the silicon substrate 19 is a silicon oxide film permeable to hydrogen, rather than the gate ONO film 30, then the silicon oxide film 29 may be formed by thermal oxidation. The silicon oxide film 29 may not be formed, but the intermediate-refractive-index film 28 may be formed directly on the surfaces of the gate electrodes 26 and the surfaces of the photodiodes 15. Thereafter, an interlayer insulating film 25 is formed on the surface of the intermediate-refractive-index film 28. Contact holes 38 are then formed in those regions of the silicon oxide film 27, the intermediate-refractive-index film 28, and the interlayer insulating film 25 which are disposed over the gate electrodes 26. The contact holes 38 serve as hydrogen alloying holes which allow hydrogen to pass therethrough via the intermediate-refractive-index film 28 to the silicon substrate 19 upon hydrogen alloying.

Figure 12D:
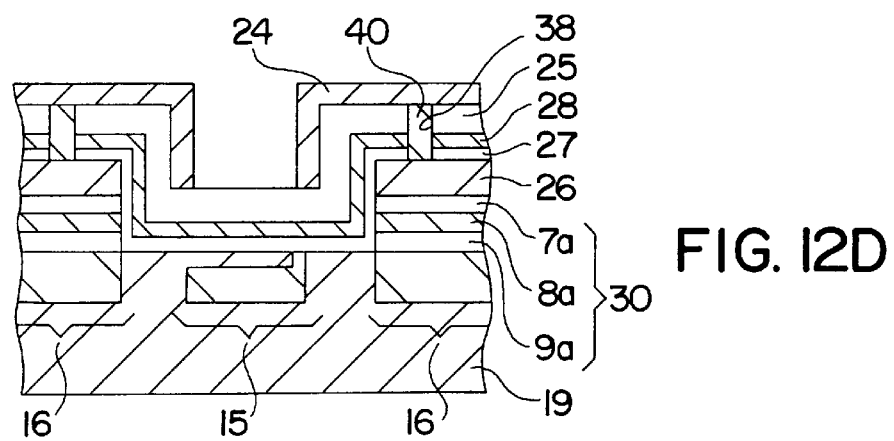

As shown in FIG. 12D, light blocking films 24 of tungsten which double as low-resistance film interconnections are formed on and around regions of the surface of the interlayer insulating film 25 over the gate electrodes 26. When the light blocking films 24 are formed, the contact holes 38 are filled with an electrically conductive material 40 of tungsten. The electrically conductive material 40 in the contact holes 38 electrically connects the gate electrodes 26 and the light blocking films 24 to each other. Thereafter, as shown in FIG. 11, the protective layer 23, the planarizing film 22, and the microlens array 21 are deposited successively in the order named, thereby fabricating the solid-state imaging device according to the second embodiment.

According to the above process of manufacturing the solid-state imaging device, hydrogen alloying for removing oxygen in the silicon substrate 19 is carried out after the protective film 23 is formed or after the planarizing film 22 is formed. Upon hydrogen alloying, hydrogen cannot pass through the intermediate-refractive-index film 28 which is a silicon nitride film, but can pass through the tungsten in the contact holes 38. The hydrogen which has passed through the contact holes 38 passes between ends of the silicon nitride film 8a and the intermediate-refractive-index film 28, as shown in FIGS. 12C and 12D, to reach the silicon substrate 19. Therefore, a hydrogen alloying effect is sufficiently developed to reduce a dark current.

In the solid-state imaging device according to the second embodiment, the intermediate-refractive-index film 28 as a reflection-resistant film and the silicon oxide film 29 are disposed on the surfaces of the photodiodes 15, as with the solid-state imaging device according to the first embodiment. Therefore, incident light applied to the photodiodes 15 is reflected with a low reflectance from the silicon substrate 19. As a result, the solid-state imaging device has a high sensitivity.

In the case where the gate electrodes 26 are backed up and connected by the light blocking film 24, the intermediate-refractive-index film 28 is formed also between the gate electrodes 26 and the light blocking film 24. For backing up and connecting the light blocking film 24, the contact holes 38 which double as hydrogen alloying holes are formed in the intermediate-refractive-index film 28. According to the second embodiment, therefore, it is not necessary to etch away unwanted regions of the intermediate-refractive-index film 28 except for those corresponding to the photodiodes 15. Since no etching step is needed to form hydrogen alloying holes, the number of etching steps required is not increased.

While preferred embodiments of the present invention have been described using specific terms, such description is for illustrative purposes only, and it is to be understood that changes and variations may be made without departing from the spirit or scope of the following claims.

What is claimed is:

1. A solid-state imaging device comprising:
   a semiconductor substrate having a sensor disposed in a surface layer on an entrance surface thereof for receiving incident light;
   an intermediate-refractive-index film disposed on the entire entrance surface of said semiconductor substrate either directly or with an insulating film interposed therebetween, said intermediate-refractive-index film having a refractive index lower than said semiconductor substrate and a low hydrogen permeability;
   a thin film disposed on an entrance surface of said intermediate-refractive-index film and having refractive index lower than said intermediate-refractive-index film, said thin film being permeable to hydrogen and being insulating; and
   a gate electrode disposed on an entrance surface of said thin film over a part except said sensor;
   said intermediate-refractive-index film having at least one hole defined in a region thereof except for regions corresponding to said sensor and said gate electrode.

2. A solid-state imaging device according to claim 1, wherein said intermediate-refractive-index film is made of silicon nitride, and said thin film is made of silicon oxide.

3. A solid-state imaging device comprising:
   a semiconductor substrate having a sensor disposed in a surface layer on an entrance surface thereof for receiving incident light;
   a gate electrode disposed on a region of the entrance surface of said semiconductor substrate except for a region corresponding to said sensor, with an insulating film interposed between said gate electrode and said semiconductor substrate;
   an intermediate-refractive-index film disposed on the entrance surface of said semiconductor substrate and an entrance surface of said gate electrode either directly or with an insulating film interposed therebetween, said intermediate-refractive-index film having a refractive index lower than said semiconductor substrate and a low hydrogen permeability; and
   a thin film disposed on an entrance surface of said intermediate-refractive-index film and having a refractive index lower than said intermediate-refractive-index film, said thin film being permeable to hydrogen;
   a contact hole defined through said thin film and said intermediate-refractive-index film and extending from an entrance surface of said thin film in a region thereof corresponding to said gate electrode to the entrance surface of said gate electrode;
   an electrically conductive material filled in said contact hole and permeable to hydrogen; and
   a light blocking film disposed on the region of the entrance surface of said thin film which corresponds to at least said gate electrode, said light blocking film being made of an electrically conductive material.

4. A solid-state imaging device according to claim 3, wherein said intermediate-refractive-index film is made of silicon nitride, and said thin film is made of silicon oxide.

5. A solid-state imaging device according to claim 1, wherein said at least one hole has an elongate slot-like shape.

6. A solid-state imaging device according to claim 1, wherein said intermediate-refractive-index film is made of a material selected from the group consisting of tantalum oxide, titanium oxide and strontium titanate.

7. A solid-state imaging device according to claim 3, wherein said intermediate-refractive-index film is made of a material selected from the group consisting of tantalum oxide, titanium oxide and strontium titanate.

* * * * *